US009680438B2

(12) United States Patent
Raz et al.

(10) Patent No.: US 9,680,438 B2
(45) Date of Patent: Jun. 13, 2017

(54) METHOD AND DEVICE FOR PLAYING MODIFIED AUDIO SIGNALS

(71) Applicant: Meq Inc., Albany, CA (US)

(72) Inventors: Ofer Nlssim Raz, Albany, CA (US); Danny Aronson, Tel Aviv (IL)

(73) Assignee: MEQ INC., Albany, CA (US)

( * ) Notice: Subject to any disclaimer, the term of this patent is extended or adjusted under 35 U.S.C. 154(b) by 0 days.

(21) Appl. No.: 14/788,954

(22) Filed: Jul. 1, 2015

(65) Prior Publication Data

US 2017/0005634 A1 Jan. 5, 2017

(51) Int. Cl.

*H04R 29/00* (2006.01)
*H03G 9/00* (2006.01)
*H03G 9/14* (2006.01)
*G06F 3/16* (2006.01)

(52) U.S. Cl.

CPC ............... *H03G 9/14* (2013.01); *G06F 3/165* (2013.01)

(58) Field of Classification Search

CPC . H04R 5/033; H04R 5/04; H04R 1/10; H04R 1/1083; H04R 1/1091; H04R 2225/43; H04R 2225/55; H04R 25/30; H04R 25/70; H04R 29/00; H04R 3/00; H04R 2430/01; H04S 2400/11; H04S 7/304; A61B 5/12; A61B 5/121; G10L 21/003; G06F 3/165

See application file for complete search history.

(56) References Cited

U.S. PATENT DOCUMENTS

2007/0195963 A1* 8/2007 Ko .......................... H04S 7/306 381/26
2009/0147962 A1* 6/2009 Sieben ..................... A61B 5/12 381/58
2011/0137111 A1* 6/2011 Hanley .................. A61B 5/121 600/28
2013/0314524 A1* 11/2013 Lee .......................... H04R 5/04 348/77
2014/0254828 A1* 9/2014 Ray ........................ H03G 5/165 381/103
2016/0050507 A1* 2/2016 Moore .................. A61B 5/123 381/57

FOREIGN PATENT DOCUMENTS

WO 2014028783 A1 2/2014

* cited by examiner

*Primary Examiner* — Thang Tran
(74) *Attorney, Agent, or Firm* — Browdy and Neimark, PLLC

(57) ABSTRACT

A method and a device are provided for modifying audio signals in accordance with hearing capabilities of an individual who is listening to audio signals played by a music player. The method comprises the steps of: providing a music player operative to play audio signals, wherein the music player comprises a processor configured to modify audio signals that are about to be played, by taking into account the hearing capabilities of the individual; providing information that relates to the hearing capabilities of the individual; forwarding the information that relates to the hearing capabilities of the individual, from an electronic device to the music player; and using the music player processor to modify audio signals when the individual is listening to audio signals being played by the music player, wherein the audio signals are modified before they are played by taking into account the individual's hearing capabilities.

18 Claims, 2 Drawing Sheets

100 PROVIDING A SET OF HEADPHONES CONFIGURED TO PERFORM A SELF-ADMINISTERED HEARING TEST

110 ACTIVATING A DEDICATED SMARTPHONE APPLICATION AND ESTABLISHING A COMMUNICATION LINK BETWEEN THE SMARTPHONE AND THE SET OF HEADPHONES

120 DOWNLOADING THE HEARING TEST RESULTS TO THE SMARTPHONE

130 UPLOADING DATA RELATING TO THE HEARING CAPABILITIES TO A REMOTE SERVER

140 RE-ACTIVATING THE SMARTPHONE APPLICATION WHEN THE INDIVIDUAL WISHES TO LISTEN TO MUSIC

150 DETERMINING THAT THE INDIVIDUAL WISHES TO LISTEN TO THE MUSIC IN A MODIFIED FORM

160 ANNALYZING DATA ASSOCIATED WITH THE INDIVIDUAL'S HEARING CAPABILITIES AND DETERMINING HOW TO MODIFY INPUT AUDIO SIGNAL, WHEN THE INDIVIDUAL DECIDES TO LISTEN TO MUSIC

METHOD AND DEVICE FOR PLAYING MODIFIED AUDIO SIGNALS

TECHNICAL FIELD

The present disclosure relates to the field of consumer electronics, and in particular to devices that enable listening to audio signals being played.

BACKGROUND

Hearing capabilities change from one person to the other, hence audio signals to which the users are able to listen, change from one person to the other, depending primarily on one's hearing capabilities. The term "hearing range" usually describes the range of frequencies that can be heard by humans, though it can also refer to the range of levels. The human range is commonly given as 20 to 20,000 Hz, but there is considerable variation between different individuals, especially at high frequencies, and a gradual decline with age is considered normal. Sensitivity also varies with frequency, as shown by equal-loudness contours. Individual hearing range varies according to the general condition of a human's ears. The range shrinks during life, usually beginning at around age of eight with the upper frequency limit being reduced. Women typically experience a lesser degree of hearing loss than men, with a later onset. Men have approximately 5 to 10 dB greater loss in the upper frequencies by the age of 40. On top of that, there may also be substantial differences between one's hearing capabilities in the left and right ears.

In view of the above it is clear that the listening experience of each user could be enhanced when audio signals to which he/she listens, fits that individual. Unfortunately, there are no solutions to this problem yet, so that the options available for the users who wish to improve their listening experience, are for example the following:

Retrieving information form professional audio review websites that offer insight and commentary on the quality of headphones that they can purchase;

Retrieving information from bulletin boards and other public forums that provide comments relating to the products' quality from actual customers of the products;

Looking up for retailers that carry the items the user is interested in and determine if it would be possible to try them out; and Testing models owned by friends or colleagues.

Although these solutions may help a user in assessing possible headphones that would better suit his needs, this is not a solution to the problem of tailoring the headphones to each specific user based on his/her own hearing capabilities, and obviously not to scenarios where the user listens to audio signals played by a device that is not provided with the option of plugging headphones thereto.

The few proposals for personalized headphones known in the art are for example the following ones:

US 20140016795 discloses a personalized headphone comprising a first speaker and a second speaker; a cord, having a removable connector plug at a distal end adapted to maintain audio communication with the first speaker and/or the second speaker, wherein the cord comprises an audio device connector plug adapted to maintain electrical communication with a digital playback device, wherein the audio output of the speakers has a built-in preconfigured equalizer personalized to a user's age, audio file format, audio file data encoding rate and music genre.

US 20060050908 describes a system and method that determines parameters for rendering headphone audio information, based on a user's preferred acoustic rendering in a non-headphone environment. A user configures a loudspeaker-based system for a preferred ambiance. Microphones on a head-mounted device then detect the audio signals received by the user in this environment. These detected signals are compared to the audio information that is being provided by the user's audio system and the differences are used to characterize the user's particular environment. Based on this characterization, when the user uses a headphone device to listen to the audio information, a headphone driver modifies the audio information to produce audio signals at the speakers in the user's headphone to effectively reproduce the audio signals that would have been produced at the user's ears by the loudspeakers in the user's particular environment.

The Applicant's U.S. 62/032,572 filed on Aug. 3, 2014, discloses a method and a device for modifying audio signals in accordance with hearing capabilities of an individual who is listening to audio signals being played via a set of headphones. The method provided is based on information obtained from a hearing test which the individual had taken, and when a set of headphones is used by that individual while listening to audio signals, the signals are modified into a form that takes into account the individual's hearing capabilities.

Yet, none of the solutions described above, provides a solution to the problem of enhancing the individual's listening experience by modifying the audio signals in a way that takes into consideration his/her hearing capabilities, when the audio signals are played by a new/different device or even by a device that has no socket to connect a set of headphones that may comprise a circuitry adapted to perform such a modification of the signals being played.

SUMMARY OF THE DISCLOSURE

The disclosure may be summarized by referring to the appended claims.

It is an object of the present invention to provide a new method to modify audio signals in accordance with hearing capabilities of a user who is listening to the audio signals.

It is still another object of the present invention to provide a music player which is capable of modifying audio signals in accordance with hearing capabilities of an individual who is listening to the audio signals based on information related to the hearing capabilities of that individual, which is received from another electronic device.

It is another object of the present invention to provide a method for storing information that relates to the hearing capabilities of an individual remotely from the music player, and when that individual wishes to listen to a musical creation played by a music player, the information may be retrieved and forwarded to the music player, which then modifies the audio signals prior to their playing in accordance with the hearing capabilities of that individual.

Other objects of the present invention will become apparent from the following description.

According to a first embodiment of the present disclosure, there is provided a method for modifying audio signals in accordance with hearing capabilities of an individual who is listening to audio signals when played by a music player, the method comprises the steps of:

providing a music player (e.g. music center, internet radio, streamer etc.) operative to play audio signals, wherein the music player comprises a processor configured to modify audio signals that are about to be played, by taking into account the hearing capabilities of the individual;

providing information that relates to the hearing capabilities of the individual (e.g. results of one or more hearing tests taken by the individual, information derived from one or more hearing tests taken by the individual, etc.);

forwarding the information that relates to the hearing capabilities of the individual, from an electronic device (such as for example, a remote server, a smartphone, a computer, a tablet, a PDA, and the like) to the music player; and using the music player processor to modify audio signals when the individual is listening to audio signals being played by the music player, wherein the audio signals are modified before they are played while taking into account the individual's hearing capabilities.

The term "hearing test" as used herein throughout the specification and claims is used to denote a test carried out to determine hearing capabilities of one or both ears of an individual. The hearing test may be conducted as two separate tests, each for a different ear of the individual, or as one test for determining the combined individual's hearing capabilities, when both ears are being subjected simultaneously to the hearing test.

The term "hearing capabilities" as used herein throughout the specification and claims is used preferably but not exclusively to denote gaps that exist between tones that may be heard by an individual who listens to music and the musical tones as they should have been heard by the individual, had he/she had a perfect hearing ability. The gap may be different for different frequencies (or for different ranges of frequencies) and may vary between the individual's ears. These gaps, providing a characterization associated with each individual, may be used to allow affecting certain modifications of various musical tones played by the music player in order to decrease these gaps, thereby enhancing the individual's experience when listening to a musical creation played by the music player.

When reference is made throughout the specification and claims to "information that relates to the hearing capabilities of the individual", it should be understood to encompass each of the following options, or a combination thereof: the results of one or more hearing tests carried which the individual has undergone, and any data that was derived from the results of the one or more hearing tests, e.g. data to enable modifying the audio signals for that individual (such as compensation related data).

According to another embodiment, the information that relates to the hearing capabilities of the individual, comprises deviations in the hearing capabilities of the individual from a pre-defined hearing pattern.

In accordance with another embodiment, the information that relates to the hearing capabilities of the individual, is forwarded wirelessly from the electronic device to the music player.

By another embodiment, the electronic device (e.g. a server implementing a cloud storage) is located remotely from the music player and is configured to store the information that relates to the hearing capabilities of the individual.

The term "located remotely" which relates to the electronic device described herein, is used herein throughout the specification and claims to denote an electronic device that is placed/installed at a different geographical location.

According to still another embodiment, the electronic device comprises storage means and is configured to forward the information that relates to the hearing capabilities of the individual, in response to a triggering action initiated by or on behalf of the individual.

In accordance with yet another embodiment, the information that relates to the hearing capabilities of the individual, is stored at a storage comprised in the music player, and in response to a triggering action initiated by or on behalf of the individual while using an electronic device being a different device from the music player, a message is conveyed to the music player, and the stored information is retrieved by the processor of the music player and applied while modifying the audio signals to a form that takes into account the individual's hearing capabilities.

According to yet another embodiment, the triggering action comprises generating a message by or on behalf of the individual by using a device other than the electronic device, and forwarding the generated message to the electronic device. For example, the message is generated by using the individual's smartphone and is sent to a remote server. In response to receiving this message, the remote server is configured to forward the information to one or more music players.

According to another aspect of the present disclosure, there is provided a music player (e.g. a media player, a music center, etc.) capable of modifying audio signals in accordance with hearing capabilities of an individual who is listening to audio signals being played by the music player, the music player comprising:

a receiver configured to receive information from another electronic device, wherein the information relates to the hearing capabilities of the individual;

a processor configured to:

(i) receive the information received by the receiver;

(ii) determine audio signals that will be played to the individual; and (iii) modify the audio signals by taking into account hearing capabilities of the individual;

a sound generating module operative to play the modified audio signals to the individual.

According to another embodiment the information received by the receiver, comprises deviations in the hearing capabilities of the individual from a pre-defined hearing pattern.

In accordance with another embodiment, the receiver is operative to receive the information that has been transmitted wirelessly thereto.

By another embodiment, the other electronic device is a server (e.g. implementing cloud storage) that is located remotely from the music player and is configured to store the information that relates to the hearing capabilities of the individual.

According to still another embodiment, the music player further comprises a user interface (e.g. a button or a set of buttons) configured to enable receiving a command initiated by or on behalf of the individual, wherein the command comprises identification of the individual.

By yet another embodiment, the music player further comprises a transmitter operative to transmit towards the electronic device a command received by the music player from or on behalf of the individual, instructing the electronic device to convey the information that relates to hearing capabilities of that individual, towards the music player.

In accordance with still another embodiment, the music player further comprises a storage configured to store information that relates to hearing capabilities of that individual.

According to another embodiment the processor is further configured to retrieve information that relates to hearing capabilities of that individual from the music player's storage, and apply it for modifying the audio signals that are about to be played.

In accordance with yet another embodiment, the information that relates to the hearing capabilities of the individual comprises data which relate to at least one of the individual's ears, at least one frequency at which the audio signal will be modified and the modification that will be affected (e.g. change of amplitude, change of level of the compensating signal, etc.) to the portion of the audio signal associated with that at least one frequency.

According to yet another embodiment, the information that relates to the hearing capabilities of the individual, comprises information that enables the processor to determine a comfortable volume baseline for the individual.

By yet another aspect there is provided a computer program product encoding a computer program stored on a non-transitory computer-readable medium for executing a set of instructions by one or more computer processors for establishing a process for carrying out the method of the present disclosure.

BRIEF DESCRIPTION OF THE DRAWINGS

For a more complete understanding of the present invention, reference is now made to the following detailed description taken in conjunction with the accompanying drawings wherein.

DETAILED DESCRIPTION

In this disclosure, the term "comprising" is intended to have an open-ended meaning so that when a first element is stated as comprising a second element, the first element may also include one or more other elements that are not necessarily identified or described herein, or recited in the claims.

In the following description, for the purposes of explanation, numerous specific details are set forth in order to provide a better understanding of the present invention by way of examples. It should be apparent, however, that the present invention may be practiced without these specific details.

Figure 1:
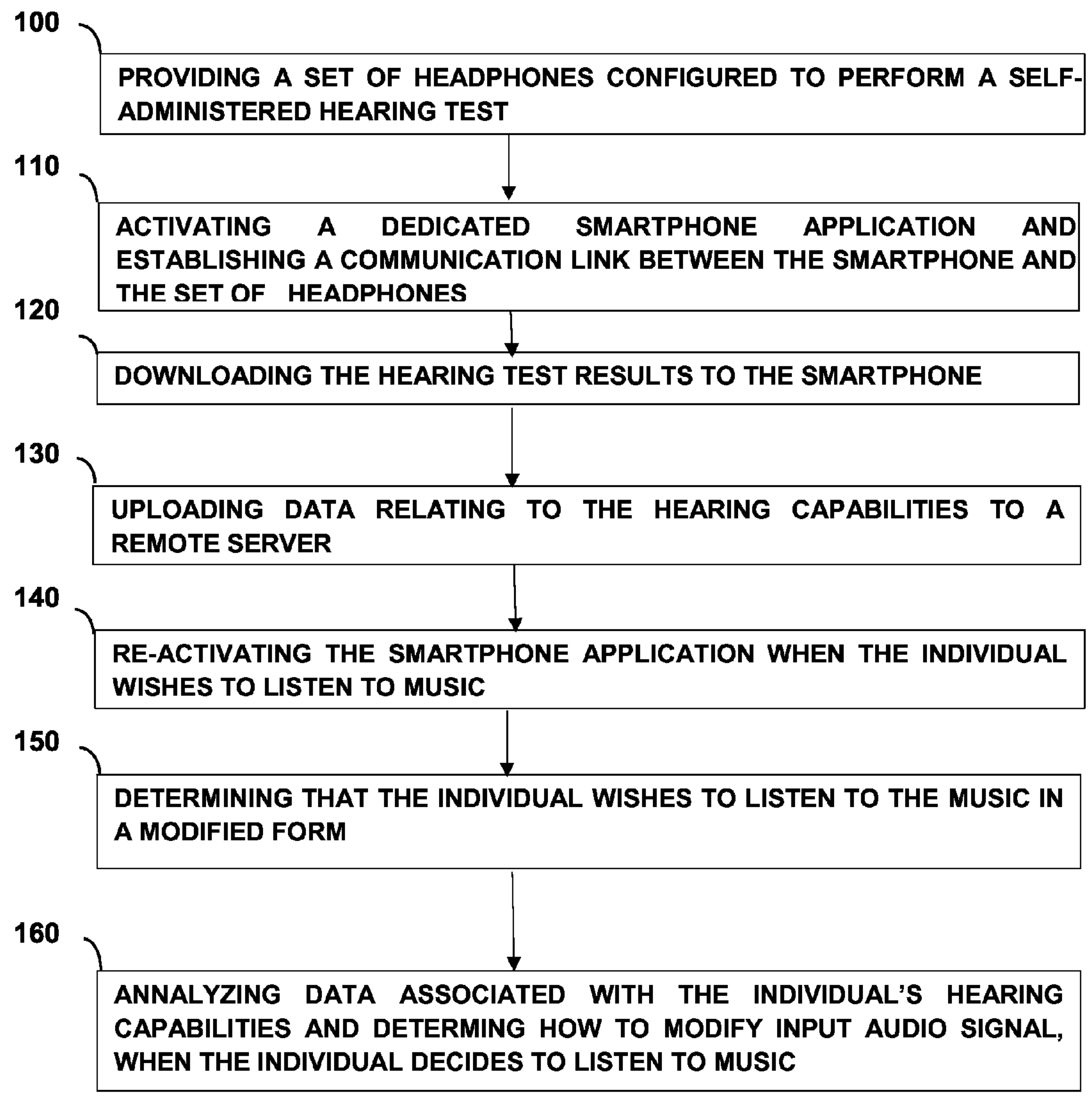
FIG. 1—is a flow diagram exemplifying a method carried out in accordance with an embodiment of the present invention.

FIG. 1 is a flow diagram being a non-limiting example of a method carried out in accordance with an embodiment of the present invention.

In step 100 a set of headphones, comprising a DSP component having a software embedded thereon, is used to allow an individual to go through a hearing test Optionally, this test differs from standard hearing tests as it may be designed to test primarily frequencies that pertain to the comprehension and enjoyment of music, and is thus different from conventional tests that focus solely on frequencies that make speech more comprehensible for those experiencing a hearing loss.

The hearing test is performed separately for each of the individual's ears, resulting in two distinct audiograms, one for the individual's left ear and for his/her right ear, being stored (preferably temporarily) at the set of headphones which was used by the individual to carry out the hearing test.

The term "audiogram" as used herein is used to denote a graph that shows the audible threshold for frequencies as measured by an audiometer. The Y axis represents intensity measured in decibels while the X axis represents frequency measured in Hertz. The threshold of hearing is plotted relative to a standardized curve that represents normal hearing, in dB.

For humans, normal hearing is between −10 dB and 15 dB, although 0 dB from 250 Hz to 8 kHz is deemed to be 'average' normal hearing. Typically, hearing thresholds of humans are found by using hearing tests which involve different tones being presented at a specific frequency (pitch) and intensity (loudness). When the person hears the sound he/she presses a button so that the testing means recognizes that that tone was heard. The lowest intensity sound one can hear at each frequency being tested, would be recorded.

Next, after completing the test, the individual activates a dedicated application stored on his/her smartphone (or any other applicable device) which in turn establishes a connection (e.g. by using a Wi-Fi connection, a Bluetooth connection, a wired connection and the like) with the set of headphones (step 110). The data which relates to the individual's hearing test results, are then downloaded to his/her smartphone (step 120), while being either in a non-processed form or in a processed or semi-processed form.

Once the data is downloaded to the smartphone, a connection is established (e.g. via the Internet) between the smartphone and a remote server, in order to upload data from the smartphone to that remote server (e.g. cloud storage) (step 130).

Next, according to the present example, when the individual decide in the future to listen to music, he/she will turn on the music player (e.g. a new audio system construed in accordance with the present disclosure), and will activate (step 140) an appropriate application installed on his/her smartphone or an application that resides at the music player itself. For example—if the individual has the appropriate TV device that may connect directly to a server for downloading to that server, the information that relates to the hearing capabilities of that individual (his/her hearing profile).

The application identifies the music player and the individual is asked if he/she wishes to have the audio signals that will be played by that music player, modified in accordance with his/her hearing capabilities (step 150). If the individual replies affirmatively (e.g. while using the smartphone keyboard), an activating command is triggered, one which eventually leads to downloading the appropriate data from the remote server to the music player.

As should be appreciated, step 150 is only an optional step, since by activating the application stored at the smartphone for the second time, it may recognize the second activation action as being the affirmative response to the question of whether the individual wishes to have the audio signals modified in accordance with his/her hearing capabilities.

As was already mentioned hereinabove, the method provided by the present invention is configured to allow modifying audio signals in accordance with the hearing capabilities of the individual who is about to listen to a musical creation comprising the audio signals that are about to be modified. However, in order to carry out such modifications, the data retrieved in the hearing test are processed so that eventually they can be translated into a form that would enable appropriate modification of the audio signals. For example, to modify the audio signals differently, depending on their frequencies (or frequency ranges to which they belong). Such a translation may involve for example establishing deviations in the hearing capabilities of the individual from a pre-defined hearing pattern. As will be appreciated by those skilled in the art, the processing of the hearing test results, may be carried out at any device along a chain that comprises the set of headphones, the smartphone, the remote server and the music player, depending on various considerations (e.g. the impact of adding processing power and/or storage to the device price). The present invention should be understood to encompass all these options.

Irrespective of where the actual processing of the individual's audiograms takes place, the hearing test results are analyzed (step 160) in order to determine which ranges of frequencies of the audio signals will be modified when the respective individual would listen to music, and what will be the level of compensation at each of these ranges.

At first, the analysis results are compared by executing a compensation algorithm with a pre-defined pattern (e.g. a straight line having a volume equal to zero throughout the whole frequencies' spectrum that was checked in the test), and then the compensating algorithm, which may include equalization process, determines the frequency ranges at which the audio signals will be modified by applying the appropriate compensation associated with the respective individual. In other words, the compensating algorithm uses predetermined equalizing (EQ) bands and curves to determine the compensation that will be provided to each of the individual's ears. Typically, the compensation (e.g. the frequency ranges in which the modification will be carried out and/or the magnitude of compensation) that will be provided to the audio signals reaching the individual's left ear will be different from the compensation that will be provided to the audio signals reaching the individual's right ear, based on the resulting audiograms. It should be noted that determining the required compensation is a complex process, which takes into account different frequencies and bands (in terms of the range(s) of frequencies affected) and does not create a simple "mirror" image of the individual's audiograms. Instead, it is preferably used to generate a smooth and enjoyable equalized curve for each ear. For example, if an individual has a 3 db drop at around 500 Hz, it might be more musically pleasing to enhance the frequencies around 500 Hz by 2.5 db through a broadband curve extending from 450 Hz to 570 Hz, rather than just bumping the 500 Hz drop by 3 db. Another option could be for example to reduce the level of few frequencies around the 500 Hz frequency instead of bumping the signal at the 500 Hz frequency.

When the individual decides to listen to music, whether by using a new music player or a music player that had been used by that individual before, the data resulting from the compensation algorithm is provided to two customized equalizers (for the L/R ears) of the music player, in such a way that the audio signals may be modified in each of the two channels accordingly. The data may be retrieved from a storage comprised in the music player, if that music player has already been used before by that individual and if that music player comprises a storage means, or may be retrieved ad-hoc from the remote server or from the individual smartphone, depending on where it has been stored, irrespective of whether this is a new music player or one that has already been used.

Optionally, but not necessarily, after completing the compensation process described above for both ears of the user, the individual is able to carry out a test where he listens to a piece of music with and without the modification, and then indicates whether a different compensation should be applied. After the individual has indicated that the compensation results are satisfactory, the equalization data (i.e. Frequency, Volume and "Q" value are forwarded to the DSP comprised within the set of headphones itself, with or without changing the firmware embedded at the DSP and storing the customized equalization data in the set of headphones.

The value of parameter "Q" referred to above, relates to the angle and scope of the gain given for each frequency band. It may be very sharp and bell shaped, thus affecting only a rather narrow range of frequencies, or on the other hand it may be quite flat and large, thus affecting a larger range of frequencies.

Forwarding the data to the music player may be done by using a USB, wireless communication (e.g. WiFi, Bluetooth etc.), audio input encoded as audio signal or any other applicable technology, or any combination thereof.

Although the compensation process described in this example relates to compensating each ear separately, it should be clear that the present invention also encompasses cases where the compensation is made for one ear only, or where there is essentially the same compensation for both ears of the individual. At the latter case, the hearing test may be one test where both ears are tested simultaneously to receive a combined result, or that the ears are tested separately and the results obtained for each of the two ears are combined while determining the compensation that will be applied while modifying the audio signals.

Figure 2:
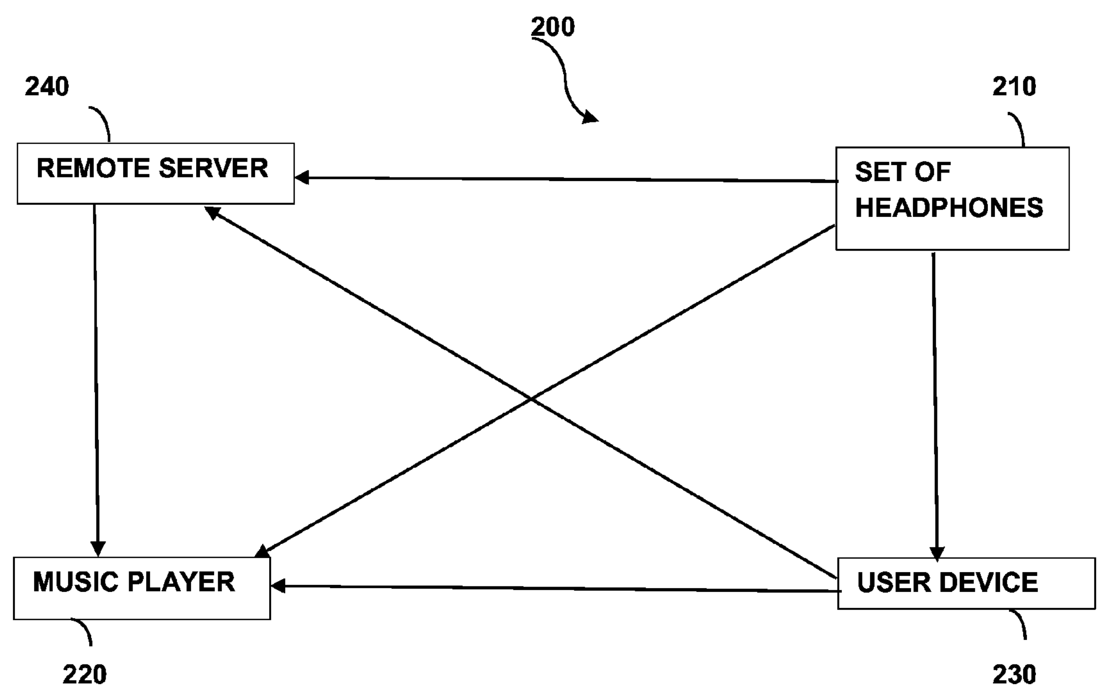
FIG. 2—is an example of a block diagram presenting a system and optional connections between its components for implementing an embodiment of the present invention.

FIG. 2 is a block diagram presenting a system 200 for implementing one or more embodiments of the present invention.

System 200 of the example illustrated in this FIG., comprises the following components:

- A set of headphones 210 for carrying out the hearing test as described above;
- A music player 220 such as a music center;
- An optional user device 230 such as a smartphone, tablet, etc. which is used in some of the embodiments described hereinafter; and
- An optional remote server 240, which is used in some of the embodiments described hereinafter.

The set of headphones 210 comprises a sound generator configured to generate the tones that will be heard by the individual while taking the hearing test and a processor configured to retrieve the results of the hearing test. In addition, the set of headphones comprises a transmitter (e.g. a cellular transmitter, or a Wi-Fi transmitter or a Bluetooth transmitter and the like) that is operative to forward the results of the hearing tests. The results that will be forwarded may be in a form of the raw results obtained during the test, or in the alternative, they can be processed by the processor comprised in the set of headphones, so that the data that will be forwarded by the headphones' transmitter will already be in a processed form (e.g. identifying one or more frequencies where there is a deviation of the individual hearing capability from a pre-defined pattern).

According to the present example, the hearing test related data being forwarded from the set of headphones, may be forwarded towards any one of the other three components of system 200, depending on the implemented embodiment.

According to one group of embodiments, the hearing test related data may be forwarded to music player 220 immediately (e.g. by using a Wi-Fi/Bluetooth protocols if the set of headphones and the music player are both located at a geographical proximity, to allow using such a transfer of data mechanism), or it may be stored at the set of headphones until the set of headphones and the music player are brought to a geographical proximity, which in turn allows such a transfer of data. The transfer of data to the music player will be carried out either automatically, or be initiated by the individual.

According to another group of embodiments, the hearing test related data may be forwarded and uploaded to a user device 230 (such as a smartphone), either immediately (e.g. by using a Wi-Fi/Bluetooth protocols if the smartphone and the set of headphones are both located at a geographical proximity), or it may be stored at the set of headphones and when the set of headphones and the smartphone are brought to a geographical proximity allowing such a transfer of data, the transfer of data to the smartphone will be carried out either automatically, or be initiated by the individual (e.g. by activating a proper application on his/her smartphone).

Once the data has been uploaded to the smartphone, there are again two options of how to proceed with the process. By the first option, the data will be forwarded e.g. over the Internet, to a remote server for storage, and by the second, the data will be forwarded to the music player. As before, if the data arriving the smartphone (the user device) is in a form of raw test results (or even partially processed), they may either be processed by the smartphone processor as described above and then forwarded, or the data may be further forwarded as received.

In the case that data is transferred directly from the smartphone to the music player, it can be done either on a one time basis, where data is transferred to the music player and stored thereat. An option that ensures that whenever that individual uses that music player, he/she will be identified and the audio signals will be modified in accordance with that individual's hearing capabilities. In the alternative, the data may be stored at the individual's smartphone, and when the individual would like to listen to music played by any music player that may operate in a way that is compatible with the present invention, the smartphone will provide the music player with the data required in order to modify the audio signals in accordance with the individual's hearing capabilities.

According to still another group of embodiments, the hearing test related data may be forwarded to be uploaded onto the remote server 240. It can be done either directly from the set of headphones 210 (e.g. by using a cellular modem) or from smartphone 230, after the data was first uploaded to that smartphone. In this group of embodiments, once the individual has indicated his/her wish to listen to a music while using a certain music player, that indication is forwarded to the remote server (e.g. by way of a message specifying the identity of the individual who is currently interested in listening to the music, and preferably the identity (e.g. the IP address) of the music player to which data associated with the identified individual that was retrieved from the storage means of the remote server, should be sent.

There is a number of options that may be implemented in system 200 to enable the individual to indicate his/her wish to listen to music that has been modified according to his/her hearing capabilities. One such option is a user interface installed at the music player (e.g. a button or a set of buttons), that once used by the individual, a message is generated and sent either to the remote server or to the individual's smartphone, depending on where the data that is required by the music player processor for carrying out the modifications, is stored. Another option is that the message is initiated by the individual by typing a pre-defined command, using the keyboard of his/her smartphone.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention in any way. The described embodiments comprise different features, not all of which are required in all embodiments of the invention. Some embodiments of the present invention utilize only some of the features or possible combinations of the features. Variations of embodiments described herein and embodiments of the present invention comprising different combinations of features noted in the described embodiments will occur to persons of the art. The scope of the invention is limited only by the following claims.

The invention claimed is:

1. A method for modifying audio signals in accordance with hearing capabilities of an individual who is listening to audio signals played by a music player, the method comprises the steps of:

providing a music player operative to play audio signals, wherein the music player comprises a processor configured to modify audio signals that are about to be played, by taking into account the hearing capabilities of the individual;

providing two distinct audiograms, one for each of the individual's ears;

identifying, based on the two distinct audiograms, one or more frequencies where there is a deviation in the individual hearing capability from a pre-defined pattern and determining, based on the two distinct audiograms, modifications to be affected to audio signals when played at said one or more frequencies;

forwarding information that relates to the hearing capabilities of the individual, from an electronic device to the music player, wherein the information includes identification of the one or more frequencies and the modifications to be affected to audio signals when being played at said one or more frequencies; and using the music player processor to modify audio signals when the individual is listening to audio signals being played by the music player, wherein the audio signals are modified before they are played while taking into account the identified one or more frequencies and the determined modifications that should be affected to audio signals when being played at said one or more frequencies.

2. The method of claim 1, wherein modifying the audio signals includes executing a compensation algorithm for each ear separately to address the individual's hearing capabilities.

3. The method of claim 1, wherein the information that relates to the hearing capabilities of the individual, is forwarded wirelessly from the electronic device to the music player.

4. The method of claim 1, wherein the electronic device is a server that is located remotely from the music player and is configured to store the information that relates to the hearing capabilities of the individual.

5. The method of claim 1, wherein the electronic device comprises storage means and is configured to forward the information that relates to the hearing capabilities of the individual, in response to a triggering action initiated by or on behalf of the individual.

6. The method of claim 1, wherein the information that relates to the hearing capabilities of the individual, is stored at a storage comprised in the music player, and in response to a triggering action initiated by or on behalf of the individual while using an electronic device being a different device from the music player, a message is conveyed to the music player, and the stored information is retrieved by the processor of the music player and applied while modifying the audio signals to a form that takes into account the individual's hearing capabilities.

7. The method of claim 5, wherein the triggering action comprises generating a message by or on behalf of the individual by using a device other than the electronic device, and forwarding the generated message to the electronic device.

8. A music player capable of modifying audio signals in accordance with hearing capabilities of an individual who is listening to audio signals being played by the music player, said music player comprising:

a receiver configured to receive information from an electronic device, wherein the information relates to the hearing capabilities of the individual with respect to each of the individual's ears and includes identification on one or more frequencies where there is a deviation of the individual hearing capability from a pre-defined pattern and information on modifications to be affected to audio signals when played at said one or more frequencies;

a processor configured to:

(i) receive the information received by the receiver; and (ii) modify the audio signals to be played to the individual by taking into account hearing capabilities of that individual including the identification of one or more frequencies and the information on modifications; and a sound generating module operative to play the modified audio signals.

9. The music player of claim 8, wherein modifying the audio signals includes executing a compensation algorithm for each ear separately to address the individual's hearing capabilities.

10. The music player of claim 8, wherein the receiver is operative to receive the information that has been transmitted wirelessly thereto.

11. The music player of claim 8, wherein the electronic device is a server located remotely from the music player and configured to store the information that relates to the hearing capabilities of the individual.

12. The music player of claim 8, wherein the music player further comprises a user interface configured to enable receiving a command initiated by or on behalf of the individual, wherein the command comprises identification of the individual.

13. The music player of claim 8, wherein the music player further comprises a transmitter operative to transmit a command received by the music player from or on behalf of the individual towards the electronic device, instructing the electronic device to forward the information that relates to hearing capabilities of that individual, towards the music player.

14. The music player of claim 8, further comprising a storage configured to store information that relates to hearing capabilities of that individual.

15. The music player of claim 14, wherein the processor is further configured to retrieve information that relates to hearing capabilities of that individual from said storage, and apply it for modifying the audio signals that are about to be played.

16. The music player of claim 8, wherein the information that relates to the hearing capabilities of the individual comprises data which relate to at least one of the individual's ears, at least one frequency at which the audio signal will be modified and the modification that will be affected to a portion of the audio signal associated with that at least one frequency.

17. The music player of claim 8, wherein the information that relates to the hearing capabilities of the individual, comprises information that enables the processor to determine a comfortable volume baseline for the individual.

18. A set of headphones configured to generate audio signals from a music player in accordance with hearing capabilities of an individual, said set of headphones comprising:

a processor configured to identify, based on two distinct audiograms, one or more frequencies where there is a deviation of the individual hearing capability from a pre-defined pattern and to determine based on the two distinct audiograms, modifications to be affected to audio signals when played by the music player at said one or more frequencies;

a transmitter configured to transmit to the music player information that relates to the hearing capabilities of the individual, wherein the information includes identification of the one or more frequencies and the determined modifications; and a sound generator module operative to play modified audio signals, wherein the audio signals are modified by the music player and take into account the identified one or more frequencies and the determined modifications.

* * * * *